United States Patent
Kim et al.

(10) Patent No.: US 7,772,587 B2
(45) Date of Patent: Aug. 10, 2010

(54) SILICON-BASED LIGHT EMITTING DIODE FOR ENHANCING LIGHT EXTRACTION EFFICIENCY AND METHOD OF FABRICATING THE SAME

(75) Inventors: Kyung Hyun Kim, Daejeon (KR); Nae Man Park, Daejeon (KR); Chul Huh, Daejeon (KR); Tae Youb Kim, Seoul (KR); Jae Heon Shin, Daejeon (KR); Kwan Sik Cho, Daejeon (KR); Gun Yong Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 86 days.

(21) Appl. No.: 12/096,764

(22) PCT Filed: Mar. 14, 2006

(86) PCT No.: PCT/KR2006/000905
§ 371 (c)(1),
(2), (4) Date: Jun. 9, 2008

(87) PCT Pub. No.: WO2007/066854
PCT Pub. Date: Jun. 14, 2007

(65) Prior Publication Data
US 2008/0303018 A1    Dec. 11, 2008

(30) Foreign Application Priority Data
Dec. 9, 2005 (KR) ............. 10-2005-0121045
Feb. 25, 2006 (KR) ............. 10-2006-0018509

(51) Int. Cl.
*H01L 29/06* (2006.01)
*H01L 21/00* (2006.01)

(52) U.S. Cl. ............ 257/13; 257/14; 257/57; 257/59; 257/E33.068; 257/E33.073; 438/22; 438/45; 438/48; 438/149

(58) Field of Classification Search .......... 257/9, 257/13, 14, 59, 79, E31.095, E33.068, E33.073, 257/52, 55, 57; 438/45, 962, 22, 48, 149
See application file for complete search history.

(56) References Cited

U.S. PATENT DOCUMENTS
6,410,942 B1    6/2002    Thibeault et al.
(Continued)

FOREIGN PATENT DOCUMENTS
JP    2003-008054    1/2003

OTHER PUBLICATIONS
M. Khizar et al., "Nitride deep-ultraviolet light-emitting diodes with micro lens array", Applied Physics Letters, 86, Apr. 18, 2005, pp. 173504-1-173504-3.
(Continued)

*Primary Examiner*—Victor A Mandala
*Assistant Examiner*—Whitney Moore
(74) *Attorney, Agent, or Firm*—Rabin & Berdo, P.C.

(57) ABSTRACT

Due to the indirect transition characteristic of silicon semiconductors, the light extraction efficiency of a silicon-based light emitting diode is lower than that of a compound semiconductor-based light emitting diode. For this reason, there are difficulties in practically using and commercializing silicon-based light emitting diodes developed so far. Provided is a silicon-based light emitting including: a substrate with a lower electrode layer on a lower surface thereof; a lower doped layer that is formed on an upper surface of the substrate and supplies carriers to an emitting layer; the emitting layer that is a silicon semiconductor layer including silicon quantum dots or nanodots formed on the lower doped layer and has a light-emitting characteristic; an upper doped layer that is formed on the emitting layer and supplies carriers to the emitting layer; an upper electrode layer formed on the upper doped layer; and a surface structure including a surface pattern formed on the upper electrode layer, a surface structure including an upper electrode pattern and an upper doped pattern formed by patterning the upper electrode layer and the upper doped layer, or a surface structure including the surface pattern, the upper electrode pattern, and upper doped pattern, wherein the surface structure enhances the light extraction efficiency of light emitted from the emitting layer according to geometric optics.

19 Claims, 8 Drawing Sheets

U.S. PATENT DOCUMENTS

| | | |
|---|---|---|
| 6,903,379 B2 | 6/2005 | Wang et al. |
| 2002/0141006 A1 | 10/2002 | Pocius et al. |
| 2003/0127655 A1* | 7/2003 | Choi et al. .................. 257/79 |
| 2005/0139847 A1 | 6/2005 | Kim et al. |
| 2005/0173717 A1 | 8/2005 | Lee et al. |

FOREIGN PATENT DOCUMENTS

| | | |
|---|---|---|
| JP | 2003086835 A * | 3/2003 |
| KR | 19990051970 | 7/1999 |
| KR | 20010038538 | 5/2001 |
| KR | 20030061069 | 7/2003 |
| KR | 20040096871 | 11/2004 |

* cited by examiner

SILICON-BASED LIGHT EMITTING DIODE FOR ENHANCING LIGHT EXTRACTION EFFICIENCY AND METHOD OF FABRICATING THE SAME

TECHNICAL FIELD

The present invention relates to a light emitting diode and a method of fabricating the same, and more particularly, to a silicon-based light emitting diode and a method of fabricating the same

BACKGROUND ART

In general, light emitting diodes which are formed of a compound semiconductor, such as GaAs, InP, GaN, etc., are widely used as a rear light source for traffic signals, outdoor advertising displays, liquid crystal displays, telephone keypads. Such light emitting diodes using compound semiconductors are incompatible with other photoelectric devices using silicon-based semiconductors. Therefore, silicon-based light emitting diodes that do not use compound semiconductors have been suggested. Furthermore, silicon-based light emitting diodes can be fabricated at low costs, and CMOS technologies can be used to fabricate silicon-based light emitting diodes, and silicon-based light emitting diodes can be efficiently integrated.

However, due to the indirect transition characteristic of silicon semiconductors, the light extraction efficiency of a silicon-based light emitting diode is lower than that of a compound semiconductor-based light emitting diode. For this reason, there are difficulties in practically using and commercializing silicon-based light emitting diodes developed so far.

DISCLOSURE OF INVENTION

Technical Problem

The present invention provides a silicon-based light emitting diode that can enhance light extraction efficiency.

The present invention provides an easy method of fabricating a silicon-based light emitting diode that can enhance light extraction efficiency.

Technical Solution

According to an aspect of the present invention, there is provided a silicon-based light emitting diode comprising: a substrate with a lower electrode layer on a lower surface thereof; a lower doped layer that is formed on an upper surface of the substrate and supplies carriers to an emitting layer; the emitting layer that is a silicon semi-conductor layer including silicon quantum dots or nanodots formed on the lower doped layer and has a light-emitting characteristic; an upper doped layer that is formed on the emitting layer and supplies carriers to the emitting layer; an upper electrode layer formed on the upper doped layer; and a surface structure including a surface pattern formed on the upper electrode layer, a surface structure including an upper electrode pattern and an upper doped pattern formed by patterning the upper electrode layer and the upper doped layer, or a surface structure including the surface pattern, the upper electrode pattern, and upper doped pattern, the surface structure enhancing the light extraction efficiency of light emitted from the emitting layer according to geometric optics.

The surface pattern may include a plurality of circular or polygonal cylinders. In this case, the plurality of circular or polygonal cylinders forming the surface pattern may be regularly or irregularly arranged. The surface pattern may be formed of a conductive or non-conductive transparent amorphous layer.

The present invention also provides a silicon-based light emitting diode comprising: a substrate with a lower electrode layer on a lower surface thereof; a lower doped layer that is formed on an upper surface of the substrate and supplies carriers to an emitting layer; the emitting layer that is a silicon semiconductor layer including silicon quantum dots or nanodots formed on the lower doped layer and has a light-emitting characteristic; an upper doped layer that is formed on the emitting layer and supplies carriers to the emitting layer; an upper electrode layer formed on the upper doped layer; and a surface structure including an upper electrode pattern and an upper doped pattern formed by patterning the upper electrode layer and the upper doped layer, the surface structure enhancing the light extraction efficiency of light emitted from the emitting layer according to geometric optics.

In this silicon-based light emitting diode, the surface structure may include a plurality of circular or polygonal cylinders. The plurality of circular or polygonal cylinders forming the surface pattern may be regularly or irregularly arranged.

According to another aspect of the present invention, there is provided a method of fabricating a silicon-based light emitting diode, the method comprising: forming a lower electrode layer on a lower surface of a substrate; forming a lower doped layer on an upper surface of the substrate, the lower doped layer supplying carriers to an emitting layer; forming the emitting layer having a light-emitting characteristic on the lower doped layer using a silicon semiconductor layer including silicon quantum dots or nanodots; forming an upper doped layer on the emitting layer, the upper doped layer supplying carriers to the emitting layer; forming an upper electrode layer on the upper doped layer; and forming a surface structure including a surface pattern on the upper electrode layer, a surface structure including an upper electrode pattern and an upper doped pattern obtained by patterning the upper electrode layer and the upper doped layer, or a surface structure including the surface pattern, the upper electrode pattern, and the upper doped pattern, the surface structure enhancing the light extraction efficiency of light emitted from the emitting layer according to geometric optics.

The forming of the surface structure including the surface pattern on the upper electrode layer may comprise: forming a surface layer on the upper electrode layer; forming a photoresist pattern on the surface layer; and dry-etching the surface layer using the photoresist pattern as an etch mask.

The forming of the surface structure including the upper electrode pattern and upper doped pattern may comprise: forming a photoresist pattern on the upper electrode layer; and dry-etching the upper electrode layer and the upper doped layer using the photoresist pattern as an etch mask. The surface pattern, the upper doped layer, and the upper electrode layer may be formed of amorphous layers.

The present invention also provides a method of fabricating a silicon-based light emitting diode, the method comprising: forming a lower electrode layer on a lower surface of a substrate; forming a lower doped layer on an upper surface of the substrate, the lower doped layer supplying carriers to an emitting layer; forming the emitting layer having a light-emitting characteristic on the lower doped layer using a silicon semi-conductor layer including silicon quantum dots or nanodots; forming an upper doped layer on the emitting layer, the upper doped layer supplying carriers to the emitting layer; forming an upper electrode layer on the upper doped layer; forming a surface structure including an upper electrode pattern and an upper doped pattern obtained by patterning the upper electrode layer and the upper doped layer, the surface structure enhancing the light extraction efficiency of light emitted from the emitting layer according to geometric optics.

The forming of the surface structure including the upper electrode pattern and upper doped pattern may comprise: forming a photoresist pattern on the upper electrode layer; and dry-etching the upper electrode layer and the upper doped layer using the photoresist pattern as an etch mask. The surface pattern may include a plurality of circular or polygonal cylinders. The plurality of circular or polygonal cylinders forming the surface pattern may be regularly or irregularly arranged. The upper doped layer and the upper electrode layer may be formed of amorphous layers.

ADVANTAGEOUS EFFECTS

Since a silicon-based light emitting diode according to the present invention is fabricated using a silicon-based semiconductor, not a compound semiconductor, the fabrication cost is low. In addition, the silicon-based light emitting diode according to the present invention can be fabricated using CMOS technologies and can be efficiently integrated.

A silicon-based light emitting diode according to the present invention has a surface structure with a micron-scale pattern that can enhance the light extraction efficiency according to geometric optics on the emitting layer. The surface structure can be formed by forming a surface pattern on the upper electrode layer or by dry-etching the upper electrode layer and the upper doped layer.

In addition, a silicon-based light emitting diode according to the present invention has a surface structure that can enhance the light extraction efficiency according to geometric optics and is formed by forming an upper doped layer, an upper electrode layer, and a surface layer, which are amorphous layers, and patterning the upper doped layer, the upper electrode layer, and the surface layer through dry etching.

In other words, although a silicon-based light emitting diode according to the present invention has an amorphous layer, not a crystalline layer, on the emitting layer, the light extraction efficiency can be increased by dry etching the amorphous layer.

DESCRIPTION OF DRAWINGS

The above and other features and advantages of the present invention will become more apparent by describing in detail exemplary embodiments thereof with reference to the attached drawings in which.

MODE FOR INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being 'on' another layer or substrate, it can be directly on the other layer or substrate, or intervening layers may also be present. Like reference numerals in the drawings denote like elements, and thus their description will be omitted.

Figure 1:
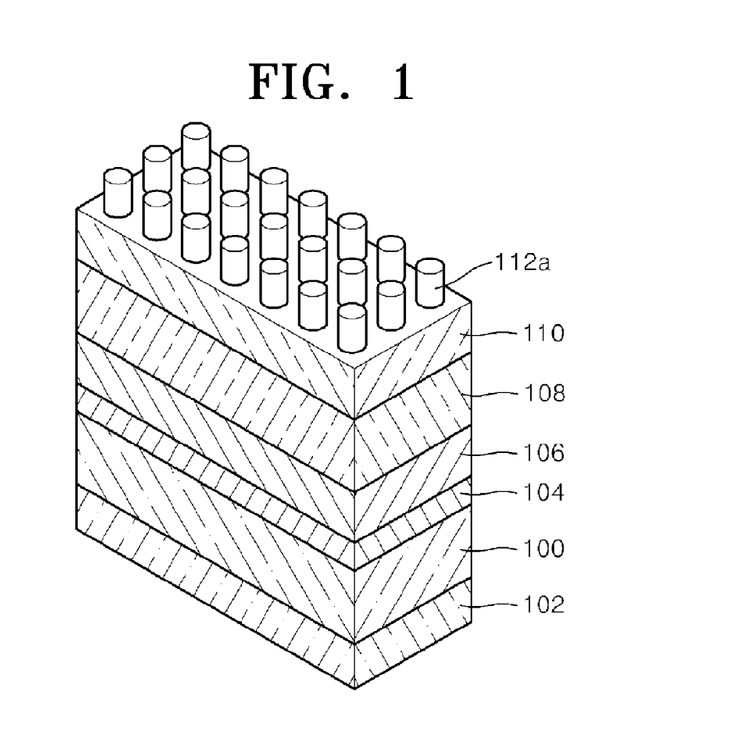
FIG. 1 is a perspective view illustrating a structure of a silicon-based light emitting diode according to an embodiment of the present invention.

FIG. 1 is a perspective view illustrating a structure of a silicon-based light emitting diode according to an embodiment of the present invention;

In particular, a lower doped layer 104 is formed on a substrate 100 with a lower electrode layer 102 on a lower surface thereof. The substrate 100 is formed of a p-type silicon substrate, or an n-type silicon substrate, or a glass substrate. The lower electrode layer 102 is formed of a metal layer. The metal layer for the lower electrode layer 102 is formed of a single layer composed of one of Au, Ag, Al, Ni, Cu, and Pt or an alloy layer of these materials.

The lower doped layer 104 is electrically coupled with the lower electrode layer 102. The lower doped layer 104 is formed of a p-type or n-type silicon doped layer. The lower doped layer 104 is formed of a silicon carbide (SiC) layer or a silicon carbon nitride (SiCN) layer. The lower doped layer 104 uniformly supplies carriers, for example, electrons or holes to an emitting layer 106, thereby enhancing light emitting efficiency. When the substrate 100 is formed of a silicon-on-insulator (SOI) substrate with a p-type silicon-doped layer or n-type silicon-doped layer, the formation of the lower doped layer 104 is optional.

The emitting layer 106 with a light-emitting characteristic is formed on the lower doped layer 104. The emitting layer 106 is formed of a silicon semiconductor layer, for example, an amorphous silicon nitride layer including silicon quantum dots or nanodots. The emitting layer 106 is formed of an amorphous layer. An upper doped layer 108 is formed on the emitting layer 106 to uniformly supply carriers, for example, electrons or holes to the emitting layer, and thus to enhance the light emitting efficiency.

The upper doped layer 108 is formed of a p-type or n-type silicon doped layer. The upper doped layer 108 is formed of an amorphous layer, such as a silicon carbide (SiC) layer or silicon carbon nitride (SiCN) layer. The lower doped layer 104 and the upper doped layer 108 formed on opposing surfaces of the emitting layer 106 have opposite conductive types.

An upper electrode layer 110 is formed of an amorphous layer on the upper doped layer 108. The upper electrode layer 110 is formed of a transparent electrode layer. The upper electrode layer 110 is electrically coupled with the upper doped layer 108. The upper electrode layer 110 is formed of an oxide electrode such as an InSnO, ZnO, $SnO_2$, NiO, or $Cu_2SrO_2$ layer, or an oxide electrode such as an n-type or p-type doped $CuInO_2$:Ca or InO:Mo layer.

A surface pattern 112a with micron-scale protrusions having a size of, for example, 1-20□ or less, is formed on the upper electrode layer 110 to enhance light extraction efficiency according to geometric optics, i.e., Snell's law. The surface pattern 112a is a surface structure for enhancing light extraction efficiency and is formed on the upper electrode layer 110 to have a rough surface with protruding and recessed regions. The effect of the surface pattern 112a enhancing the light extraction efficiency will be described later in detail.

The surface pattern 112a can be formed in various forms. For example, the surface pattern 112a may have a plurality of circular or polygonal. Each of the protrusions of the surface pattern 112a may have a micron-scale width of, for example, 1-20 um or less. The protrusions of the surface pattern 112a can be arranged in lows and columns or can be irregularly arranged.

The surface pattern 112a is formed of a transparent layer. The surface pattern 112a is formed of an amorphous layer, for example, a silicon nitride (SiN) layer. The surface pattern 112a can be formed of a conductive or non-conductive thin layer. The surface pattern 112a is formed of a material having a refractive index that is similar to (substantially the same as) or smaller than the refractive index of materials forming the upper doped layer 108 and the upper electrode layer 110 to enhance the light extraction efficiency.

In the silicon-based light emitting diode having the structure of FIG. 1, when current is supplied across the lower electrode layer 102 and the upper electrode layer 110, carriers, such as electrons or holes, enter the emitting layer 104 through the lower doped layer 104 and the upper doped layer 108. The emitting layer 104, which has received the carriers, emits light due to silicon nanodots or quantum dots therein. The light-emitting efficiency of the emitting layer 104 is increased by the surface pattern 112a. The effect of the surface pattern 112a enhancing the light-emitting efficiency will be described later in detail.

Figure 2:
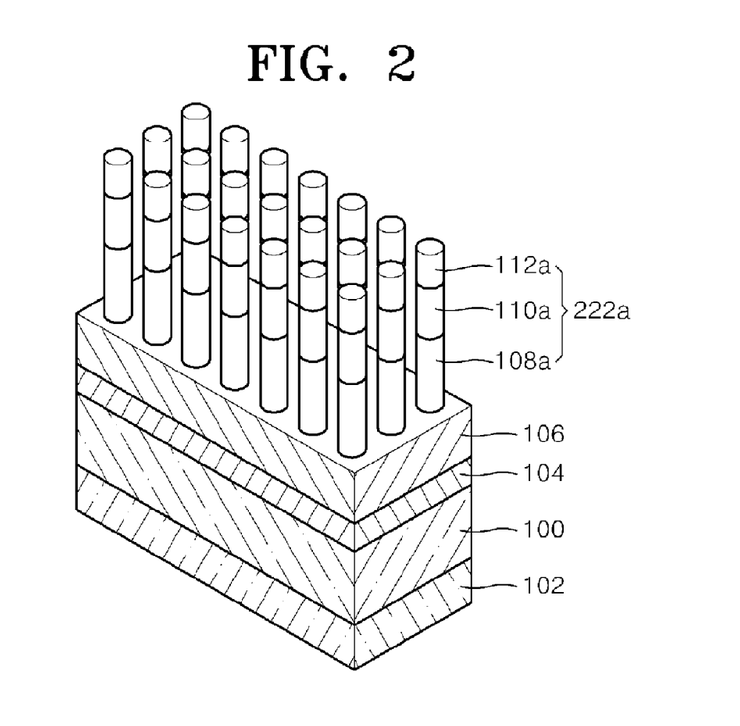
FIG. 2 is a perspective view illustrating a structure of a silicon-based light emitting diode according to another embodiment of the present invention.

FIG. 2 is a perspective view illustrating a structure of a silicon-based light emitting diode according to another embodiment of the present invention. In FIG. 2, reference numerals which are the same as in FIG. 1 represent the same elements as in FIG. 1. The silicon-based light emitting diode of FIG. 2 is the same as the silicon-based light emitting diode of FIG. 1 except that a surface structure 222a including a surface pattern 112a, an upper electrode pattern 110a, and an upper doped pattern 108a is formed to enhance light extraction efficiency.

In the silicon-based light emitting diode of FIG. 2, the lower doped layer 104 and the emitting layer 106 are formed on the substrate 100 with the lower electrode layer 102 on a lower surface thereof. The structures of the lower doped layer 104 and the emitting layer 106 are the same as in the previous embodiment. The upper doped pattern 108a, the upper electrode pattern 110a, and the surface pattern 112a are sequentially formed on the emitting layer 106.

In the silicon-based light emitting diode of FIG. 2, the upper doped pattern 108a, the upper electrode pattern 110a, and the surface pattern 112a form the surface structure 222a, thereby enhancing the light extraction efficiency according to geometric optics. In other words, the silicon-based light emitting diode of FIG. 1 can enhance the light extraction efficiency according to geometric optics due to the surface structure 222a including a plurality of cylinders.

Figure 3:
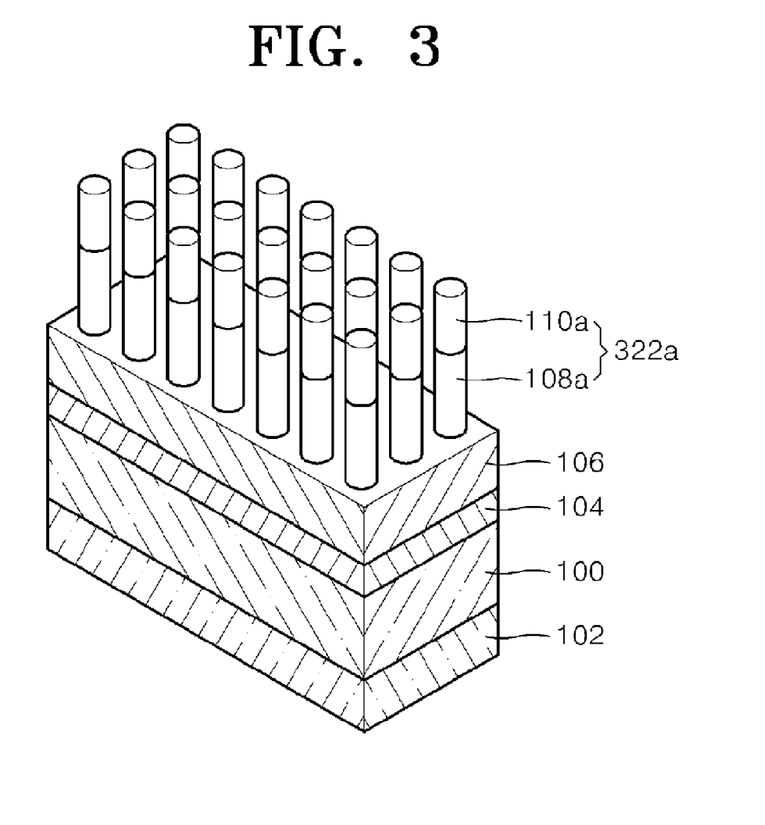
FIG. 3 is a perspective view illustrating a structure of a silicon-based light emitting diode according to another embodiment of the present invention.

FIG. 3 is a perspective view illustrating a structure of a silicon-based light emitting diode according to another embodiment of the present invention.

In particular, in FIG. 3, reference numerals which are the same as in FIGS. 1 and 2 represent the same elements as in FIGS. 1 and 2. The silicon-based light emitting diode of FIG. 3 is the same as the silicon-based light emitting diode of FIG. 2 except that the surface pattern 112a in FIG. 2 is not formed.

In the silicon-based light emitting diode of FIG. 2, the lower doped layer 104 and the emitting layer 106 are formed on the substrate 100 with the lower electrode layer 102 on a lower surface thereof. The structures of the lower doped layer 104 and the emitting layer 106 are the same as in the embodiment described with reference to FIG. 1. The upper doped pattern 108a and the upper electrode pattern 110a are sequentially formed on the emitting layer 106.

In the silicon-based light emitting diode of FIG. 3, the upper doped pattern 108a and the upper electrode pattern 110a form a surface structure 322a, thereby enhancing the light extraction efficiency according to geometric optics. In other words, the silicon-based light emitting diode of FIG. 3 can enhance the light extraction efficiency according to geometric optics due to the surface structure 322a including a plurality of cylinders.

Figure 4:
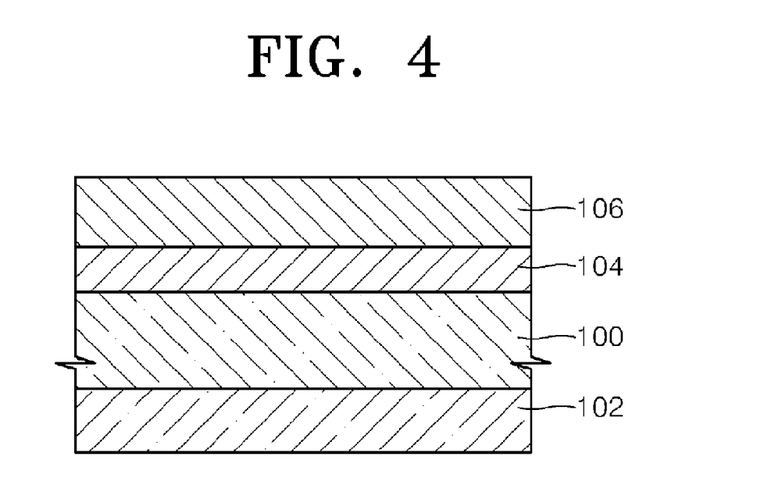
FIGS. 4 through 7 are sectional views for explaining a method of fabricating the silicon-based light emitting diode of FIG. 1.
Figure 5:
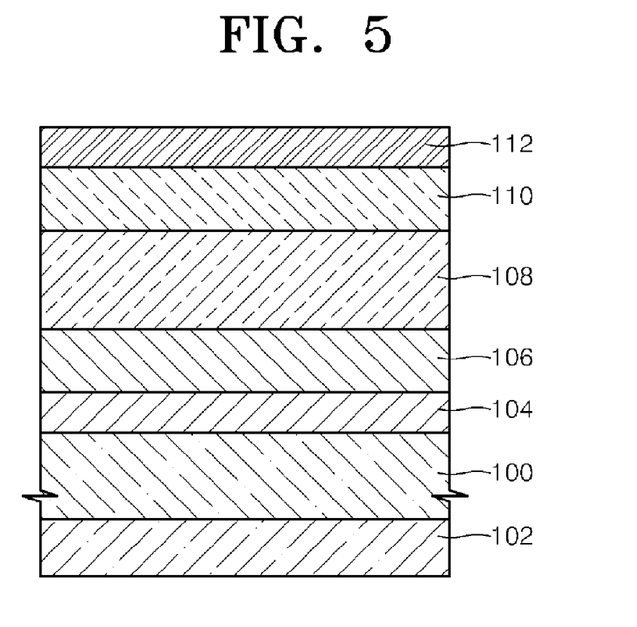

FIGS. 4 through 5 are sectional views for explaining a method of fabricating the silicon-based light emitting diode of FIG. 1.

In particular, the lower electrode layer 102 is formed on a lower surface of the substrate 100. A p-type silicon substrate, or an n-type silicon substrate, or a glass substrate is used as the substrate 100. The lower electrode layer 102 is formed by depositing a metal layer on the substrate 100. The metal layer for the lower electrode layer 102 can be formed as a single layer composed of one of Au, Ag, Al, Ni, Cu, and Pt or an alloy layer of these materials. The lower electrode layer 102 is formed to a thickness of about 150 Å.

Next, the lower doped layer 104 is formed on an upper surface of the substrate 100 with the lower electrode layer 102 on the lower surface thereof. The lower doped layer 104 is electrically coupled with the lower electrode layer 102. The lower doped layer 104 is formed of a silicon carbide (SiC) layer or silicon carbon nitride (SiCN) layer. The lower doped layer 104 is formed of a p-type or n-type silicon doped layer. When the substrate 100 is formed of a silicon-on-insulator (SOI) substrate with a p-type silicon-doped layer or n-type silicon-doped layer, the formation of the lower doped layer 104 is optional.

The emitting layer 106 with a light-emitting characteristic is formed on the lower doped layer 104. The emitting layer 106 is formed of a silicon semiconductor layer, for example, an amorphous silicon nitride layer including silicon quantum dots or nanodots. The emitting layer 106 is formed of an amorphous layer.

Referring to FIG. 5, the upper doped layer 108 is formed on the emitting layer 106. The upper doped layer 108 is formed of a p-type or n-type silicon doped layer. The upper doped layer 108 is formed by forming a material layer including dopants on the emitting layer 106 and activating the dopants through rapid thermal annealing (RTA). The material layer for the upper doped layer 108 is formed of an amorphous layer, for example, a silicon carbide (SiC) layer or silicon carbon nitride (SiCN) layer. The lower doped layer 104 and the upper doped layer 108 formed on opposing surfaces of the emitting layer 106 have opposite conductive types.

Next, the upper electrode layer 110, which is an amorphous layer, is formed on the upper doped layer 108. The upper electrode layer 110 is formed by forming a transparent electrode layer on the upper doped layer 108 through pulse laser deposition (PLD) at 150° C. not to prevent migration of carriers and emission of light from the emitting layer 106 and thermally processing the transparent electrode layer at 500° C. for 30 minutes in a vacuum. The upper electrode layer 110 is electrically coupled with the upper doped layer 108. The upper electrode layer 110 is formed by an oxide electrode, such as an InSnO, ZnO, $SnO_2$, NiO, or $Cu_2SrO_2$ layer, or an oxide electrode doped with n-type or p-type dopants, such as a $CuInO_2$:Ca or InO:Mo layer.

A surface layer 112 is formed on the upper electrode layer 110 through subsequent processes, i.e., photolithography and dry etching process, to enhance the light extraction efficiency. The surface layer 112 is formed of an amorphous layer, such as a silicon nitride (SiN) layer. The surface layer 112 is formed through plasma enhanced chemical vapor deposition (PECVD) at 250° C.

The surface layer 112 is formed of a material having a refractive index that is similar to or smaller than the refractive index of materials forming the upper doped layer 108 and the upper electrode layer 110 to enhance the light extraction efficiency.

Figure 6:
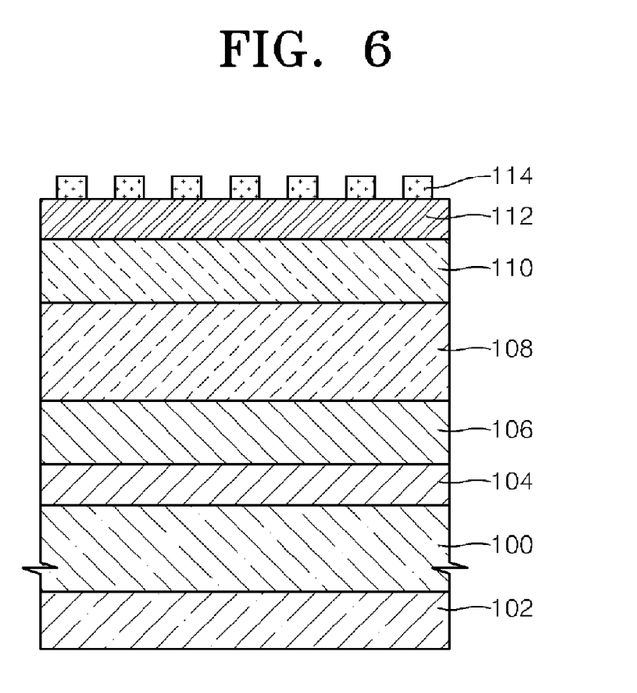

Referring to FIG. 6, a photoresist pattern 114 having a micron-scale width and interval is formed on the surface layer 112 through a photolithography process. The width and interval of the photoresist pattern 114 can be varied without limitation.

Figure 7:
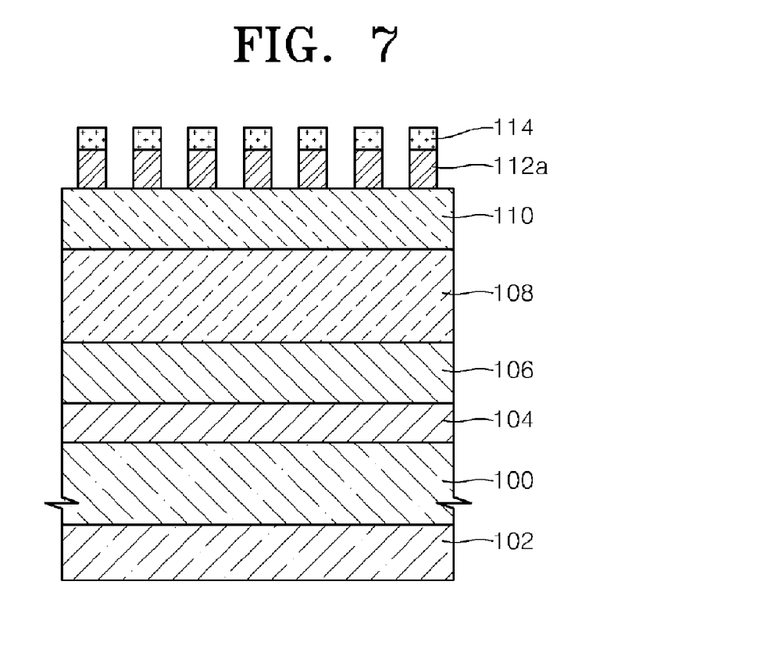

Next, referring to FIG. 7, the surface layer 112 is dry-etched using the photoresist pattern 114 as an etch mask to form the surface pattern 112a having a micron-scale size and enhancing the light extraction efficiency according to geometric optics. In other words, the surface pattern 112a is formed on the upper electrode layer 110 as a surface structure for enhancing the light extraction efficiency.

The dry etching on the surface layer 112 is performed using inductive coupled plasma (ICP) etching or reactive ion etching (RIE). The dry etching on the surface layer 112 is performed using a gas, such as $N_2$, $O_2$, Ar, $CF_4$, $SF_6$, $NF_3$, or $CHF_3$ or a mixture of these gases. For example, the dry etching may be performed at an etch power of 100 W, a self-bias voltage of 230V, a gas flow rate of $CF_4$:Ar=20:5 sccm, a process pressure of 30 mTorr, and an etch rate of 20 nm/min.

In the silicon-based light emitting diode according to the present invention, even when the surface layer 112 is formed of an amorphous layer, such as a silicon nitride (SiN) layer, not a crystalline layer, the surface pattern 112a having a desired shape can be formed. After the surface layer 112 is dry-etched, the photoresist pattern 114 is removed, thereby resulting in the silicon-based light emitting diode of FIG. 1

Figure 8:
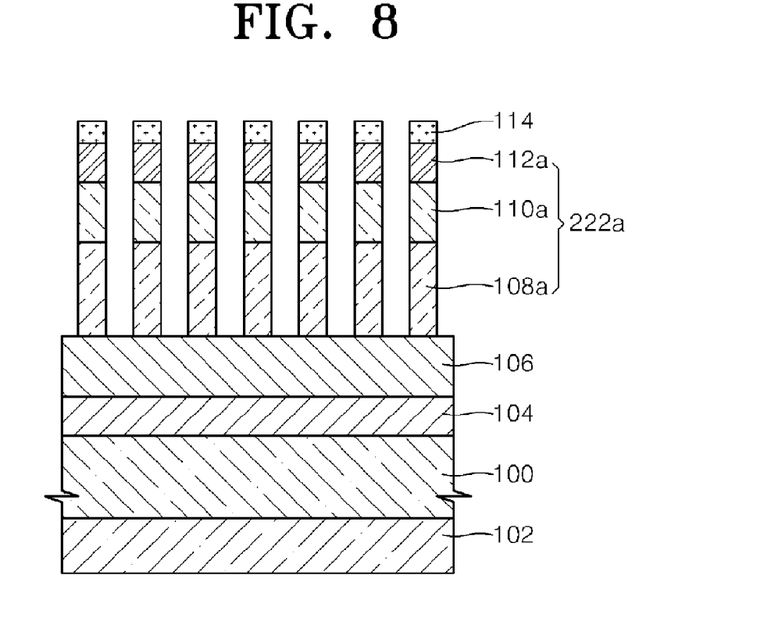
FIG. 8 is a sectional view for explaining a method of fabricating the silicon-based light emitting diode of FIG. 2.

FIG. 8 is a sectional view for explaining a method of fabricating the silicon-based light emitting diode of FIG. 2.

In FIG. 8, reference numerals which are the same as in FIGS. 4 through 7 represent the same elements as in FIGS. 4 through 7. The method of fabricating the silicon-based light emitting diode of FIG. 2 is the same as the method of fabricating the silicon-based light emitting diode of FIG. 1, except for processes of forming the surface structure 222a including the surface pattern 112a, the upper electrode pattern 110a, and the upper doped pattern 108a.

In particular, the processes described with reference to FIGS. 4 through 6 are performed to form on the surface layer 112 the photoresist pattern 114 having a micron-scale width and interval.

Next, referring to FIG. 8, the surface layer 112, the upper electrode layer 110, and the upper doped layer 108 are sequentially etched using the photoresist pattern 114 as an etch mask, thereby resulting in the surface pattern 112a, the upper electrode pattern 110a, and the upper doped pattern 108a, which have a micron-scale and form the surface structure 112a for enhancing the light extraction efficiency.

In the embodiment of FIG. 8, the etching on the surface layer 112, the upper electrode layer 110, and the upper doped layer 108 is performed through inductive coupled plasma (ICP) etching or reactive ion etching (RIE), as described with reference to FIG. 7.

In the silicon-based light emitting diode according to the present invention, even when the surface layer 112, the upper electrode layer 110, and the upper doped layer 108 in FIG. 8 are formed of amorphous layers, not crystalline layers, the surface structure 222a having a desired shape can be formed. After the surface structure 222a is formed, the photoresist pattern 114 is removed, thereby resulting in the silicon-based light emitting diode of FIG. 2.

Figure 9:
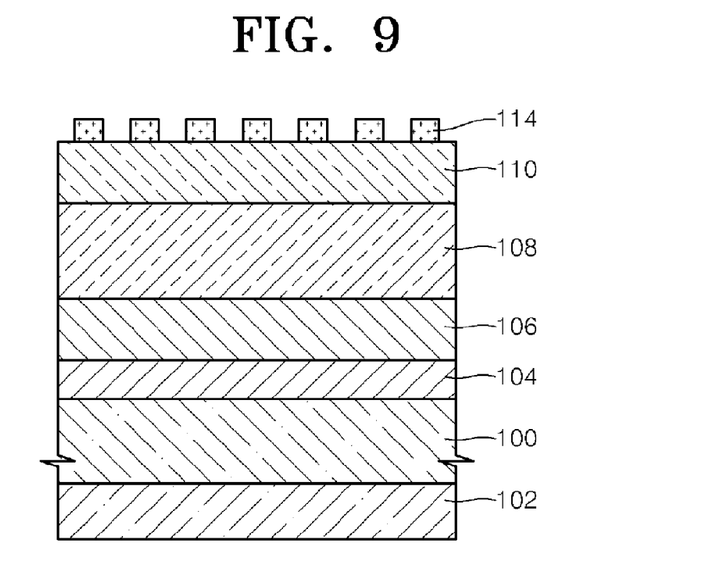
FIGS. 9 and 10 are sectional views for explaining a method of fabricating the silicon-based light emitting diode in FIG. 3.
Figure 10:
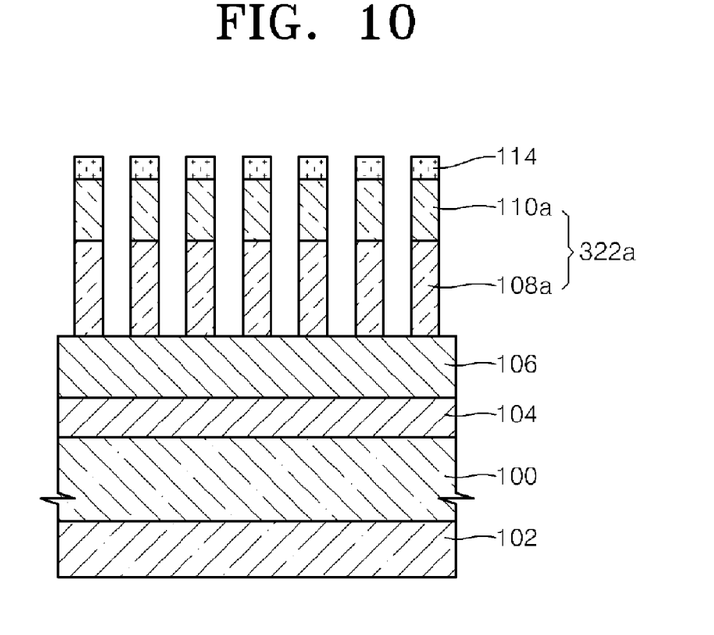

FIGS. 9 and 10 are sectional view for explaining a method of fabricating the silicon-based light emitting diode of FIG. 3.

In FIGS. 9 and 10, reference numerals which are the same as in FIGS. 4 through 7 represent the same elements as in FIGS. 4 through 7. The method of fabricating the silicon-based light emitting diode of FIG. 3 is the same as the method of fabricating the silicon-based light emitting diode of FIG. 2, except for processes of forming the surface structure 322a including only the upper electrode pattern 110a and the upper doped pattern 108a, not the surface pattern 112a.

In particular, the same processes described with reference to FIGS. 4 and 5, except for the process of forming the surface layer 112 in FIG. 5, are performed. In other words, referring to FIG. 9, the lower doped layer 104, the emitting layer 106, the upper doped layer 108, and the upper electrode layer 110 are formed on a upper surface of the substrate 100 with the lower electrode layer 102 on the lower surface thereof. Next, the photoresist pattern 114 having a micron-scale width and interval is formed on the upper electrode layer 110 through photolithography. The width and interval of the photoresist pattern 114 can be varied without limitation.

Next, referring to FIG. 10, the upper electrode layer 110 and the upper doped layer 108 are sequentially etched using the photoresist pattern 114 as an etch mask to form the upper electrode pattern 110a and the upper doped pattern 108a, which have a micron-scale size and form the surface structure 322a for enhancing the light extraction efficiency.

The etching on the upper electrode layer 110 and the upper doped layer 108 in FIG. 10 is performed through is performed through inductive coupled plasma (ICP) etching or reactive ion etching (RIE), as described with reference to FIGS. 7 and 8.

In the silicon-based light emitting diode according to the present invention, even when the upper electrode layer 110 and the upper doped layer 108 in FIG. 10 are formed of amorphous layers, not crystalline layers, the surface structure 322a having a desired shape can be formed. After the surface structure 322a is formed through etching, the photoresist pattern 114 is removed, thereby resulting in the silicon-based light emitting diode of FIG. 3.

Figure 11:
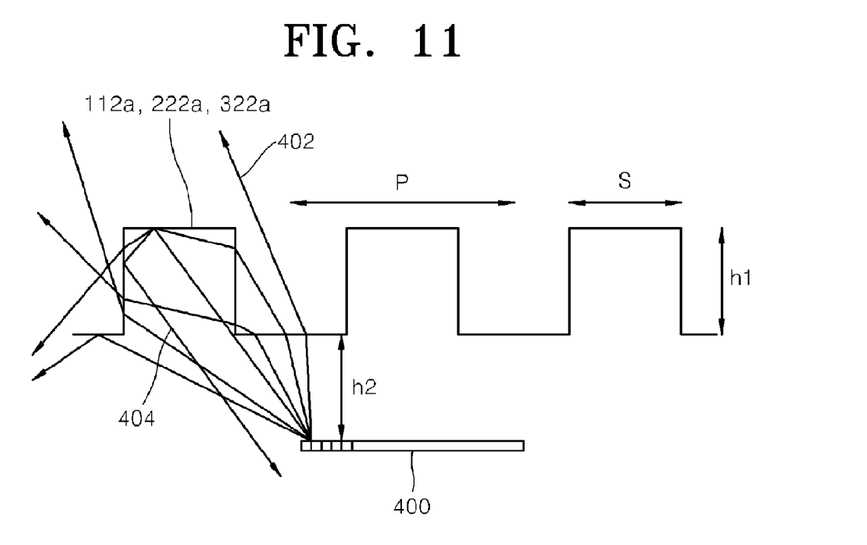
FIG. 11 is a schematic view for explaining the emission of light from a silicon-based light emitting diode according to the present invention.

FIG. 11 is a schematic view for explaining the emission of light from a silicon-based light emitting diode according to the present invention.

In particular, for the convenience of description, the emission of light from the silicon-based light emitting diode according to the present invention is described using a 1-dimensional model. It is assumed that a light source 400, which corresponds to the emitting layer 106 of the silicon-based light emitting diode, is separated from a bottom surface of the surface structure 112a, 222a or 322a according to the present invention by a distance h2, and the surface structure 112a, 222a, or 322a with a pattern of protruding and recessed portions has a height h1, a pattern period P, and a pattern size S. Accordingly, light is externally transmitted from the light source 400 through the surface structure 112a, 222a, or 322a. Due to a difference between the refractive index of the surface structure 112a, 222a, or 322a and the refractive index of the external medium, Snell's law applies.

In particular, when light is externally transmitted from the light source 400 through the surface structure 112a, 222a, or 322a according to the present invention, in addition to an optical path 402, an optical path 404 further exists according to geometric optics, thereby enhancing the light extraction efficiency.

In other words, when light is externally transmitted directly from the light source 400, not through the surface structure 112a, 222a, or 322a, only the optical path 402 exists according to geometric optics and thus, the light extraction efficiency is low. However, when light is externally transmitted from the light source 400 through the surface structure 112a, 222a, or 322a according to the present invention, both the optical paths 402 and 404 exist according to geometric optics and thus, the light extraction efficiency increases.

Figure 12:
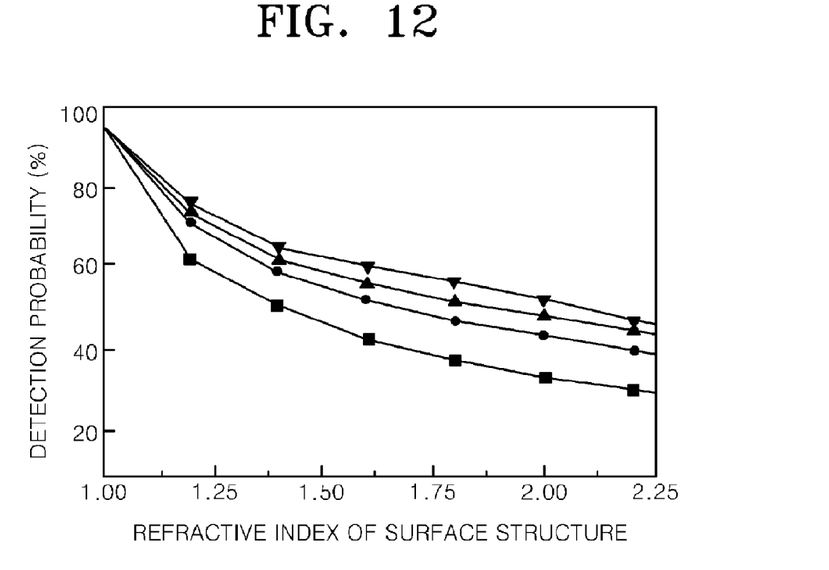
FIG. 12 is a graph of the probability of detection of emitted light with respect to refractive index of the surface structure of a silicon-based light emitting diode according to the present invention simulated using a 1-dimensional model of FIG. 11.

FIG. 12 is a graph of the probability of detection of emitted light with respect to refractive index of the surface structure of a silicon-based light emitting diode according to the present invention simulated using the 1-dimensional model of FIG. 11.

In particular, in the 1-dimensional model of FIG. 11, the pattern period P was 4□, the pattern size S was 2.4□, the angle of emission of light from the light source 400 was 8 degrees, the distance h2 between the light source 400 and the bottom surface of the surface structure 112a, 222a, or 322a was 0.5□, and the height h1 of the surface structure 112a, 222a, or 322a was varied to 0□ (■), 0.5□ (●), 1□(▲), and 1.5□(▼). As is apparent from FIG. 12, at a refractive index of 2, as the height h1 of the surface structure 112a, 222a, or 322a increases, the probability of detection of emitted light increases.

Figure 13:
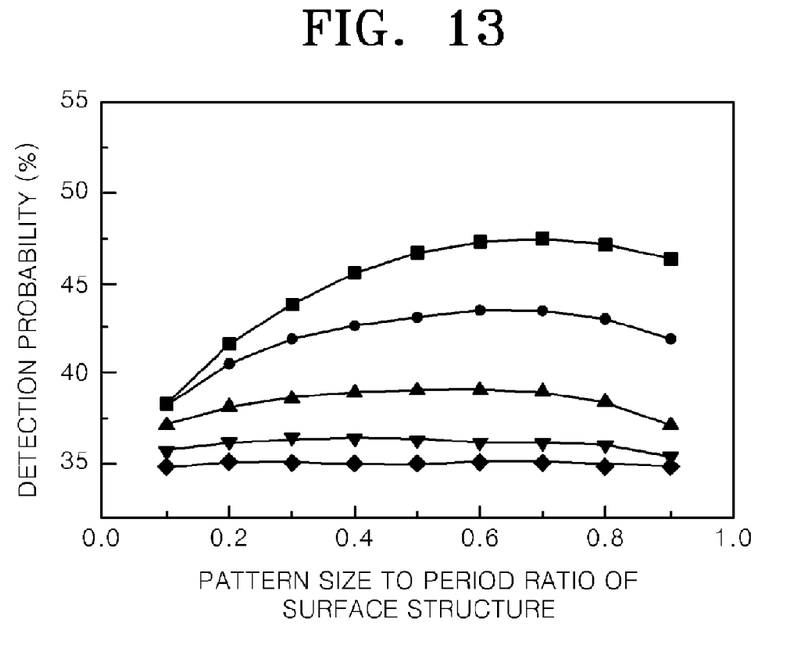
FIG. 13 is a graph of the probability of detection of emitted light with respect to the ratio of pattern size to period of the surface structure of a silicon-based light emitting diode according to the present invention simulated using the 1-dimensional model of FIG. 1.

FIG. 13 is a graph of the probability of detection of emitted light with respect to the ratio of pattern size to period of the surface structure of a silicon-based light emitting diode according to the present invention simulated using the 1-dimensional model of FIG. 1.

In particular, in the 1-dimensional model of FIG. 11, the refractive index of the surface structure 112a, 222a, or 322a was 2, the angle of emission of light from the light source 400 was 8 degrees, the distance h2 between the light source 400 and the bottom surface of the surface structure 112a, 222a, or 322a was 1□, the height h1 of the surface structure 112a, 222a, or 322a was 1□, and the pattern period P was varied to 4□(■), 8□(●), 16□(▲), 32□(▼), and 64□(♦). As is apparent from FIG. 13, the probability of detection of emitted light is highest when the pattern period is 4□, in particular, at a ratio of pattern size to period of 0.6.

As described above, when fabricating one of the silicon-based light emitting diodes of FIGS. 1 through 3 according to the present invention, the distance between the bottom surface of the surface structure and the light source, i.e., the emitting layer and the pattern period, pattern size, and height of the surface structure can be optimized based on the results of FIGS. 12 and 13.

Figure 14:
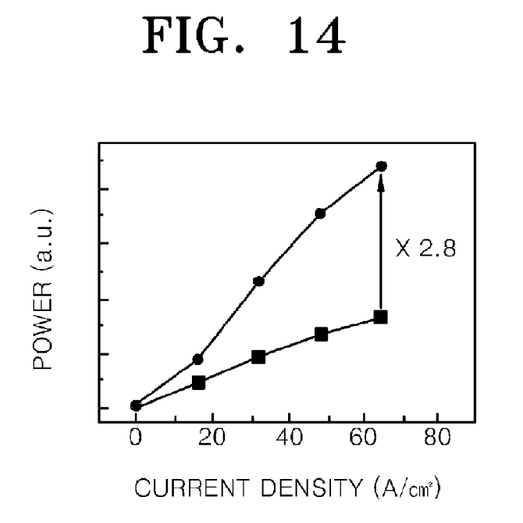
FIG. 14 is a graph for explaining the light emitting efficiency of a silicon-based light emitting diode according to the present invention.

FIG. 14 is a graph for explaining the light emitting efficiency of a silicon-based light emitting diode according to the present invention.

In particular, ● denotes the light emitting efficiency of the silicon-based light emitting diode according to the present invention having a surface structure of FIGS. 1 through 3, and ■ denotes the light emitting efficiency of a silicon-based light emitting diode without the surface structure of FIGS. 1 through 3. As is apparent from FIG. 14, the light intensity of the silicon-based light emitting diode with the surface structure is about 2.8 times higher than the silicon-based light emitting diode with the surface structure.

Figure 15:
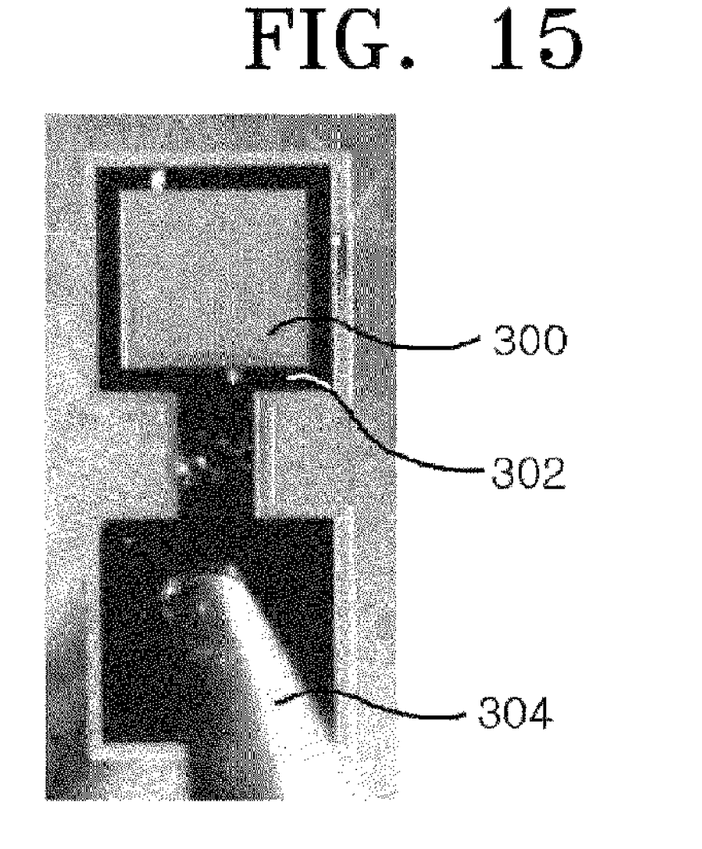
FIG. 15 is a photograph of a silicon-based light emitting diode according to the present invention taken while measuring the intensity of light emitted from the silicon-based light emitting diode.

FIG. 15 is a photograph of a silicon-based light emitting diode according to the present invention taken while measuring the intensity of light emitted from the silicon-based light emitting diode.

In particular, the photograph of FIG. 15 shows a network-like surface structure in a light emitting region 300. Comparing the light emitting region 300 in which the surface structure is shown with a boundary region 302, the light emitting region 300 is apparently brighter than the boundary region 302. In FIG. 15, reference numeral 304 denotes a pin to which a voltage is applied.

The invention claimed is:

1. A silicon-based light emitting diode comprising:
   a substrate with a lower electrode layer on a lower surface thereof;
   a lower doped layer that is formed on an upper surface of the substrate and supplies carriers to an emitting layer;
   the emitting layer that is a silicon semiconductor layer including silicon quantum dots or nanodots formed on the lower doped layer and has a light-emitting characteristic;
   an upper doped layer that is formed on the emitting layer and supplies carriers to the emitting layer;
   an upper electrode layer formed on the upper doped layer; and
   a surface structure including a surface pattern formed on the upper electrode layer, a surface structure including an upper electrode pattern and an upper doped pattern formed by patterning the upper electrode layer and the upper doped layer, or a surface structure including the surface pattern, the upper electrode pattern, and upper doped pattern, the surface pattern being formed of a transparent amorphous layer, the surface structure enhancing the light extraction efficiency of light emitted from the emitting layer according to geometric optics.

2. The silicon-based light emitting diode of claim 1, wherein the surface pattern includes a plurality of circular or polygonal cylinders.

3. The silicon-based light emitting diode of claim 2, wherein the plurality of circular or polygonal cylinders forming the surface pattern are regularly or irregularly arranged.

4. The silicon-based light emitting diode of claim 1, wherein the surface pattern is a conductive or non-conductive layer.

5. The silicon-based light emitting diode of claim 1, wherein the upper doped layer is formed of an amorphous layer selected from the group consisting of a silicon carbide (SiC) layer and a silicon carbon nitride (SiCN) layer, and the upper electrode layer is formed of one oxide electrode selected from the group consisting of an InSnO layer, an ZnO layer, a $SnO_2$ layer, a NiO layer and a $Cu_2SrO_2$ layer, or one oxide electrode selected from the group consisting of a $CuInO_2$:Ca layer and a InO:Mo layer, doped with n-type or p-type dopants.

6. A method of fabricating a silicon-based light emitting diode, the method comprising:

forming a lower electrode layer on a lower surface of a substrate;

forming a lower doped layer on an upper surface of the substrate, the lower doped layer supplying carriers to an emitting layer;

forming the emitting layer having a light-emitting characteristic on the lower doped layer using a silicon semiconductor layer including silicon quantum dots or nanodots;

forming an upper doped layer on the emitting layer, the upper doped layer supplying carriers to the emitting layer;

forming an upper electrode layer on the upper doped layer; and forming a surface structure including a surface pattern on the upper electrode layer, a surface structure including an upper electrode pattern and an upper doped pattern obtained by patterning the upper electrode layer and the upper doped layer, or a surface structure including the surface pattern, the upper electrode pattern, and the upper doped pattern, the surface pattern being formed of a transparent amorphous layer, the surface structure enhancing the light extraction efficiency of light emitted from the emitting layer according to geometric optics.

7. The method of claim 6, wherein the forming of the surface structure including the surface pattern on the upper electrode layer comprises:

forming a surface layer on the upper electrode layer;

forming a photoresist pattern on the surface layer; and dry-etching the surface layer using the photoresist pattern as an etch mask.

8. The method of claim 6, wherein the forming of the surface structure including the upper electrode pattern and upper doped pattern comprises:

forming a photoresist pattern on the upper electrode layer; and dry-etching the upper electrode layer and the upper doped layer using the photoresist pattern as an etch mask.

9. The method of claim 7, wherein the surface pattern includes a plurality of circular or polygonal cylinders.

10. The method of claim 9, wherein the plurality of circular or polygonal cylinders forming the surface pattern are regularly or irregularly arranged.

11. The method of claim 6, wherein the upper doped layer and the upper electrode layer are formed of amorphous layers.

12. A silicon-based light emitting diode comprising:

a substrate with a lower electrode layer on a lower surface thereof;

a lower doped layer that is formed on an upper surface of the substrate and supplies carriers to an emitting layer;

the emitting layer that is a silicon semiconductor layer including silicon quantum dots or nanodots formed on the lower doped layer and has a light-emitting characteristic;

an upper doped layer that is formed on the emitting layer and supplies carriers to the emitting layer;

an upper electrode layer formed on the upper doped layer, both the upper electrode layer and the upper doped layer being formed of amorphous layers; and a surface structure including an upper electrode pattern and an upper doped pattern formed by patterning the upper electrode layer and the upper doped layer, the surface structure enhancing the light extraction efficiency of light emitted from the emitting layer according to geometric optics.

13. The silicon-based light emitting diode of claim 12, wherein the surface structure includes a plurality of circular or polygonal cylinders.

14. The silicon-based light emitting diode of claim 13, wherein the plurality of circular or polygonal cylinders forming the surface pattern are regularly or irregularly arranged.

15. The silicon-based light emitting diode of claim 12, wherein the upper doped layer is selected from the group consisting of a silicon carbide (SiC) layer and a silicon carbon nitride (SiCN) layer, and the upper electrode layer is formed of one oxide electrode selected from the group consisting of an InSnO layer, an ZnO layer, a $SnO_2$ layer, a NiO layer and a $Cu_2SrO_2$ layer, or one oxide electrode selected from the group consisting of a $CuInO_2$:Ca layer and a InO:Mo layer, doped with n-type or p-type dopants.

16. A method of fabricating a silicon-based light emitting diode, the method comprising:

forming a lower electrode layer on a lower surface of a substrate;

forming a lower doped layer on an upper surface of the substrate, the lower doped layer supplying carriers to an emitting layer;

forming the emitting layer having a light-emitting characteristic on the lower doped layer using a silicon semiconductor layer including silicon quantum dots or nanodots;

forming an upper doped layer on the emitting layer, the upper doped layer supplying carriers to the emitting layer;

forming an upper electrode layer on the upper doped layer, both the upper electrode layer and the upper doped layer being formed of amorphous layers;

forming a surface structure including an upper electrode pattern and an upper doped pattern obtained by patterning the upper electrode layer and the upper doped layer, the surface structure enhancing the light extraction efficiency of light emitted from the emitting layer according to geometric optics.

17. The method of claim 16, wherein the forming of the surface structure including the upper electrode pattern and upper doped pattern comprises:

forming a photoresist pattern on the upper electrode layer; and dry-etching the upper electrode layer and the upper doped layer using the photoresist pattern as an etch mask.

18. The method of claim 16, wherein the surface pattern includes a plurality of circular or polygonal cylinders.

19. The method of claim 18, wherein the plurality of circular or polygonal cylinders forming the surface pattern are regularly or irregularly arranged.

* * * * *